United States Patent [19]
Gavrin et al.

[11] Patent Number: 4,493,023
[45] Date of Patent: Jan. 8, 1985

[54] DIGITAL DATA PROCESSING SYSTEM HAVING UNIQUE ADDRESSING MEANS AND MEANS FOR IDENTIFYING AND ACCESSING OPERANDS

[75] Inventors: Edward S. Gavrin, Lincoln; Richard G. Bratt, Wayland, both of Mass.; Stephen I. Schleimer, Chapel Hill, N.C.; John F. Pilat, Raleigh, N.C.; Michael S. Richmond, Pittsboro, N.C.; Walter A. Wallach, Jr., Raleigh, N.C.; Richard A. Belgard, Saratoga, Calif.; David A. Farber, Durham, N.C.; John K. Ahlstrom, Mountain View, Calif.; Steven J. Wallach; Gerald F. Clancy, both of Saratoga, Calif.; Craig J. Mundie, Cary; Thomas M. Jones, Chapel Hill, both of N.C.; Brett L. Bachman, Boston; David H. Bernstein, Ashland, both of Mass.

[73] Assignee: Data General Corporation, Westboro, Mass.

[21] Appl. No.: 266,403

[22] Filed: May 22, 1981

[51] Int. Cl.³ .............................................. G06F 9/30
[52] U.S. Cl. ............................................. 364/200
[58] Field of Search ... 364/200 MS File, 900 MS File

[56] References Cited

U.S. PATENT DOCUMENTS

| | | | |
|---|---|---|---|
| 4,084,227 | 4/1978 | Bennett et al. | 364/200 |
| 4,128,875 | 12/1978 | Thurber et al. | 364/200 |
| 4,173,783 | 11/1979 | Couleur et al. | 364/200 |
| 4,179,736 | 12/1979 | Wilhite | 364/200 |
| 4,241,399 | 12/1980 | Strecker et al. | 364/200 |
| 4,279,014 | 7/1981 | Cassonnet et al. | 364/200 |
| 4,279,015 | 7/1981 | Edelman et al. | 364/200 |
| 4,296,468 | 10/1981 | Bandoh et al. | 364/200 |
| 4,297,743 | 10/1981 | Appell et al. | 364/200 |
| 4,326,248 | 4/1982 | Hineai et al. | 364/200 |

Primary Examiner—Jerry Smith
Assistant Examiner—Gary V. Harkcom
Attorney, Agent, or Firm—Robert F. O'Connell

[57] ABSTRACT

A data processing system having a flexible internal structure, protected from and effectively invisible to users, with multilevel control and stack mechanisms and capability of performing multiple, concurrent operations, and providing a flexible, simplified interface to users. The system is internally comprised of a plurality of separate, independent processors, each having a separate microinstruction control and at least one separate, independent port to a central communications and memory node. The communications and memory node is an independent processor having separate, independent microinstruction control and comprised of a plurality of independently operating, microinstruction controlled processors capable of performing multiple, concurrent memory and communications operations. Addressing mechanisms allow permanent, unique identification of information and an extremely large address space accessible and common to all such systems. Addresses are independent of system physical configuration. Information is identified to bit granular level and to information type and format. Protection mechanisms provide variable access rights associated with individual bodies of information. User language instructions are transformed into dialect coded, uniform, intermediate level instructions to provide equal facility of execution for all user languages. Operands are referred to by uniform format names which are transformed, by internal mechanisms transparent to users, into addresses.

2 Claims, 1 Drawing Figure

DIGITAL DATA PROCESSING SYSTEM HAVING UNIQUE ADDRESSING MEANS AND MEANS FOR IDENTIFYING AND ACCESSING OPERANDS

CROSS REFERENCE TO RELATED APPLICATIONS

The present patent application is related to other patent applications assigned to the assignee of the present application.

BACKGROUND OF THE INVENTION

1. Field of the Invention

The present invention relates to a digital data processing system and, more particularly, to a multiprocess digital data processing system suitable for use in a data processing network and having a simplified, flexible user interface and flexible, multileveled internal mechanisms.

2. Description of Prior Art

A general trend in the development of data processing systems has been towards systems suitable for use in interconnected data processing networks. Another trend has been towards data processing systems wherein the internal structure of the system is flexible, protected from users, and effectively invisible to the user and wherein the user is presented with a flexible and simplified interface to the system.

Certain problems and shortcomings affecting the realization of such a data processing system have appeared repeatedly in the prior art and must be overcome to create a data processing system having the above attributes. These prior art problems and limitations include the following topics.

First, the data processing systems of the prior art have not provided a system wide addressing system suitable for use in common by a large number of data processing systems interconnected into a network. Addressing systems of the prior art have not provided sufficiently large address spaces and have not allowed information to be permanently and uniquely identified. Prior addressing systems have not made provisions for information to be located and identified as to type or format, and have not provided sufficient granularity. In addition, prior addressing systems have reflected the physical structure of particular data processing systems. That is, the addressing systems have been dependent upon whether a particular computer was, for example, an 8, 16, 32, 64 or 128 bit machine. Since prior data processing systems have incorporated addressing mechanisms wherein the actual physical structure of the processing system is apparent to the user, the operations a user could perform have been limited by the addressing mechanisms. In addition, prior processor systems have operated as fixed word length machines, further limiting user operations.

Prior data processing systems have not provided effective protection mechanisms preventing one user from effecting another user's data and programs without permission. Such protection mechanisms have not allowed unique, positive identification of users requesting access to information, or of information, nor have such mechanisms been sufficiently flexible in operation. In addition, access rights have pertained to the users rather than to the information, so that control of access rights has been difficult. Finally, prior art protection mechanisms have allowed the use of "Trojan Horse arguments". That is, users not having access rights to certain information have been able to gain access to that information through another user or procedure having such access rights.

Yet another problem of the prior art is that of providing a simple and flexible interface user interface to a data processing system. The character of user's interface to a data processing system is determined, in part, by the means by which a user refers to and identifies operands and procedures of the user's programs and by the instruction structure of the system. Operands and procedures are customarily referred to and identified by some form of logical address having points of reference, and validity, only within a user's program. These addresses must be translated into logical and physical addresses within a data processing system each time a program is executed, and must then be frequently retranslated or generated during execution of a program. In addition, a user must provide specific instructions as to data format and handling. As such reference to operands or procedures typically comprise a major portion of the instruction stream of the user's program and requires numerous machine translations and operations to implement. A user's interface to a conventional system is thereby complicated, and the speed of execution of programs reduced, because of the complexity of the program references to operands and procedures.

A data processing system's instruction structure includes both the instructions for controlling system operations and the means by which these instructions are executed. Conventional data processing systems are designed to efficiently execute instructions in one or two user languages, for example, FORTRAN or COBOL. Programs written in any other language are not efficiently executable. In addition, a user is often faced with difficult programming problems when using any high level language other than the particular one or two languages that a particular conventional system is designed to utilize.

Yet another problem in conventional data processing systems is that of protecting the system's internal mechanisms, for example, stack mechanisms and internal control mechanisms, from accidental or malicious interference by a user.

Finally, the internal structure and operation of prior art data processing systems have not been flexible, or adaptive, in structure and operation. That is, the internal structure and operation of prior systems have not allowed the systems to be easily modified or adapted to meet particular data processing requirements. Such modifications may include changes in internal memory capacity, such as the addition or deletion of special purpose subsystems, for example, floating point or array processors. In addition, such modifications have significantly effected the users interface with the system. Ideally, the actual physical structure and operation of the data processing system should not be apparent at the user interface.

The present invention provides data processing system improvements and features which solve the above-described problems and limitations.

SUMMARY OF THE INVENTION

The present invention relates to structure and operation of a data processing system suitable for use in interconnected data processing networks, which internal structure is flexible, protected from users, effectively invisible to users, and provides a flexible and simplified interface to users. The data processing system provides an addressing mechanism allowing permanent and unique identification of all information generated for use in or by operation of the system, and an extremely large address space which is accessible to and common to all such data processing systems. The addressing mechanism provides addresses which are independent of the physical configuration of the system and allow information to be completely identified, with a single address, to the bit granular level and with regard to information type or format. The present invention further provides a protection mechanism wherein variable access rights are associated with individual bodies of information. Information, and users requesting access to information, are uniquely identified through the system addressing mechanism. The protection mechanism also prevents use of Trojan Horse arguments. And, the present invention provides an instruction structure wherein high level user language instructions are transformed into dialect coded, uniform, intermediate level instructions to provide equal facility of execution for a plurality of user languages. Another feature is the provision of an operand reference mechanism wherein operands are referred to in user's programs by uniform format names which are transformed, by an internal mechanism transparent to the user, into addresses. The present invention additionally provides multilevel control and stack mechanisms protecting the system's internal mechanism from interference by users. Yet another feature is a data processing system having a flexible internal structure capable of performing multiple, concurrent operations and comprised of a plurality of separate, independent processors. Each such independent processor has a separate microinstruction control and at least one separate and independent port to a central communications and memory node. The communications and memory node is also an independent processor having separate and independent microinstruction control. The memory processor is internally comprised of a plurality of independently operating, microinstruction controlled processors capable of performing multiple, concurrent memory and communications operations. The present invention also provides further data processing system structural and operational features for implementing the above features.

It is thus advantageous to incorporate the present invention into a data processing system because the present invention provides addressing mechanisms suitable for use in large interconnected data processing networks. Additionally, the present invention is advantageous in that it provides an information protection mechanism suitable for use in large, interconnected data processing networks. The present invention is further advantageous in that it provides a simplified, flexible, and more efficient interface to a data processing system. The present invention is yet further advantageous in that it provides a data processing system which is equally efficient with any user level language by providing a mechanism for referring to operands in user programs by uniform format names and instruction structure incorporating dialect coded, uniform format intermediate level instructions. Additionally, the present invention protects data processing system internal mechanisms from user interference by providing multilevel control and stack mechanisms. The present invention is yet further advantageous in providing a flexible internal system structure capable of performing multiple, concurrent operations, comprising a plurality of separate, independent processors, each having a separate microinstruction control and at least one separate and independent port to a central, independent communications and memory processor comprised of a plurality of independent processors capable of performing multiple, concurrent memory and communications operations.

It is thus an object of the present invention to provide an improved data processing system.

It is another object of the present invention to provide a data processing system capable of use in large, interconnected data processing networks.

It is yet another object of the present invention to provide an improved addressing mechanism suitable for use in large, interconnected data processing networks.

It is a further object of the present invention to provide an improved information protection mechanism.

It is still another object of the present invention to provide a simplified and flexible user interface to a data processing system.

It is yet a further object of the present invention to provide an improved mechanism for referring to operands.

It is a still further object of the present invention to provide an instruction structure allowing efficient data processing system operation with a plurality of high level user languages.

It is a further object of the present invention to provide data processing internal mechanisms protected from user interference.

It is yet another object of the present invention to provide a data processing system having a flexible internal structure capable of multiple, concurrent operations.

Other objects, advantages and features of the present invention will be understood by those of ordinary skill in the art, after referring to the following detailed description of the preferred embodiments and drawings wherein:

Figure 1:
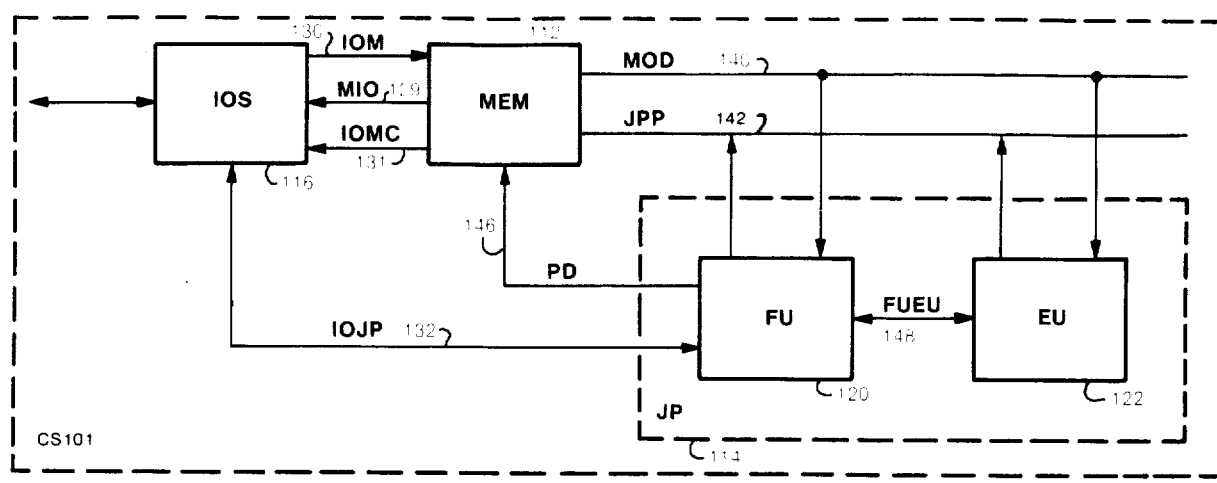
FIG. 1 is a partial block diagram of a computer system incorporating the present invention.

This application incorporates by reference the entire application, Ser. No. 266,402, filed May 22, 1981, of Baxter et al.

What is claimed is:

1. In a digital computer system including processor means for performing operations upon operands, memory means for storing said operands and instructions for directing said operations, said memory means being organized into objects for containing said operands and said instructions, bus means for conducting operands and instructions between said memory means and said processor means, and input/output (I/O) means for conducting operands between said digital computer system and devices external to said digital computer system, said processor means comprising:

arithmetic logic unit (ALU) means connected to said bus means for performing said operations, addressing means connected to said bus means for providing addresses and for controlling the transfer of said operands and instructions between said memory means and said processor means, each of said addresses comprising an object field for identifying a corresponding one of said objects, an offset field for specifying a first number of information bits of offset relative to the start of said corresponding one of said objects, and a length field for specifying a second number of information bits of said corresponding one of said objects following said first number of information bits to be transferred between said memory means and said processor means, and microcode control means for storing sequences of microinstructions for controlling said processor means and responsive to said instructions for providing said sequences of microinstructions to said processor means, said ALU means including general register file means connected to said bus means for storing selected operands and selected addresses, said general register file means comprising a plurality of vertically ordered registers vertically divided into three parallel-operating and addressed parts, a first said part of said general register file means comprising first register file means for storing object fields of said addresses, a second said part of said general register file means comprising second register file means for storing offset fields of said addresses and said selected operands, and a third said part of said general register file means comprising third register file means for storing length fields of said addresses, and address ALU means connected to said general register file means and to said bus means and responsive to first selected sequences of microinstructions for performing operations on said selected addresses, each of said operands being referred to by a corresponding name of a plurality of names and said memory means including name table means for storing name table entries, each of said name table entries corresponding to one of said names and comprising (1) first data resolvable to provide a location in said memory means of an operand referred to by said corresponding name, and, (2) second data resolvable to identify the format of said operand referred to by said corresponding name, said ALU means including means connected to said bus means and responsive to said names for reading said name table entries corresponding to said names from said name table means, and means connected to said reading means for resolving said name table entries and for providing addresses corresponding thereto to said memory means, each said address representing a location in said memory means of the operand referred to by its corresponding name.

2. The digital computer system of claim 1, wherein said processor means further comprises:

name cache means connected to said resolving means and to said bus means for receiving and storing addresses representing locations in said memory means of operands.

* * * * *